US006261956B1

(12) United States Patent
Shields

(10) Patent No.: US 6,261,956 B1
(45) Date of Patent: Jul. 17, 2001

(54) MODIFIED PRODUCT MASK FOR BRIDGING DETECTION

(75) Inventor: Jeffrey A. Shields, Sunnyvale, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/398,207

(22) Filed: Sep. 17, 1999

(51) Int. Cl.[7] .................. H01L 21/302; H01L 21/461
(52) U.S. Cl. ............................ 438/689; 438/14
(58) Field of Search .................. 438/14, 15, 18, 438/330, 689, 190, 238, 381, 382

(56) References Cited

U.S. PATENT DOCUMENTS 5,051,690 * 9/1991 Maly et al. ..................... 324/158
5,670,891 * 9/1997 Ling et al. ..................... 324/765

* cited by examiner

Primary Examiner—David Nelms
Assistant Examiner—David Nhu
(74) Attorney, Agent, or Firm—Foley & Lardner

(57) ABSTRACT

A bridging test structure is formed by using a modified product mask that has similar loading characteristics as an actual product mask. The modified product mask is used for devices having somewhat uniform structures, such as memory cell arrays with vertical and horizontal conductive lines. Even ones of the vertical lines are connected together by using a first horizontal line that is connected to a first test pad. Odd ones of the vertical lines are connected together by using a second horizontal line that is connected to a second test pad. Current is applied to one of the test pads to determine if that current is detected at the other test pad, and if so, a bridging problem is determined to exist.

10 Claims, 4 Drawing Sheets

MODIFIED PRODUCT MASK FOR BRIDGING DETECTION

BACKGROUND OF THE INVENTION

1. Field of the Invention

The present invention relates to a modified product mask for bridging detection on a semiconductor wafer.

2. Description of the Related Art

Metal or polysilicon (poly) bridging structures typically are small structures in the scribe line of a product mask. These bridging structures are used to determine if a semiconductor device formed on a wafer by a product mask is defective in the sense that bridging occurs between elements on the wafer that are supposed to be electrically separated from each other. The product mask is used to form a particular pattern onto a wafer, and is used along with a resist, such as a photoresist, to create the particular pattern. Etching is also performed to remove the resist and undesired portions of layers (e.g., poly, oxide, nitride) formed on the wafer.

A scribe line of a semiconductor wafer is the area separating individual chips on the wafer. After electrically testing the wafer to ensure that it operates properly, the wafer is partitioned into separate chips along the scribe line. A variety of testing structures are typically placed in the scribe line and are tested before the wafer is partitioned, since, after partitioning, the testing structures are removed from the actual product to be sold due to the separation of the chips from the testing structures on the scribe line.

The testing structures are typically very small since the scribe line is made as small as possible (in order to obtain the maximum possible useful area on a wafer). The small size of the testing structures is also due to the fact that there are many testing structures located on the scribe line, and these testing structures have to compete for a very small real estate on the wafer. Typically, the testing structures are made in accordance with a minimum-spacing/size design rule for the wafer. Due to their limited size and due to the testing area being much smaller than the actual product circuit, the testing structures are typically less sensitive to bridging than the actual circuit (the non-testing-structure part of the product mask).

Certain testing structures, called bridging structures, can be formed in various types of configurations. Bridging structures are testing structures that are specifically designed to test for bridging between elements or regions on a wafer. One such bridging structure 100, as shown in FIG. 1, includes conductive (e.g., metal) fingers 110A–110E that are electrically connected to each other via conductive line 115, conductive (e.g., metal) fingers 120A–120D that are electrically connected to each other via conductive line 125, and a serpentine conductive line 135 that snakes its way around each of the metal fingers 110A–110E, 120A–120D. The bridging structure 100 also includes first and second pads 145, 155 electrically connected to the conductive line 115, third and fourth pads 165, 175 electrically connected to the conductive line 125, and fifth and sixth pads 185, 195 electrically connected to the serpentine conductive line 135.

By providing a current to one pad, such as the fifth pad 185, it can be determined if that current flows to any of the first through fourth pads. If the product mask has been correctly constructed, then there should be no current flow, or bridging, between the conductive fingers 110A–110E, 120A–120D and the serpentine conductive line 135. If such a current flow is detected at any of the first through fourth pads, however, then the product mask fails the bridging test, and that wafer is determined to be defective.

The steps used to create a wafer with a testing region formed in the scribe line of a product mask are shown in FIG. 2, and described below.

In a first step 200, which may involve several process steps, transistor regions are formed, along with front ends for those devices. Poly deposition is also performed in this step. Then, in a second step 210, there is performed oxide deposition, polishing, and then contact formation. In a third step 220, a metal or poly deposition step is performed. In a fourth step 230, a photolithography step is performed. The photolithography step 230 includes a first substep of coating the wafer with a resist, a second substep of exposing the is resist with a product mask, and then a third substep of developing the pattern such as by dipping the wafer into a developing solution. In a fifth step 240, a metal or poly etching is performed in accordance with the developed pattern on the wafer. In a sixth step 250, an electrical bridging test is performed on the small scribe line structure of the wafer. In a seventh step 260, a yield test is performed, which is sensitive to the bridging in the circuit.

As mentioned above, the product mask with a small testing region formed in the scribe line has problems in that the testing region is typically less sensitive to bridging than the actual product region that it is meant to test the correct formation thereof.

Another way to test for bridging on wafers is to use a Defect Monitor Mask, or DMM, instead of the actual product mask. As opposed to the problems associated with the use of bridging structures formed only in the scribe line, the DMM forms bridging structures throughout the wafer, not just in the scribe line. The DMM is used instead of the product mask, and is used to form a special structure with many thousands of bridging structures formed throughout the wafer. Typically, the DMM is used for only a few wafers in a batch, in order to determine if the entire batch of wafers is being properly manufactured.

The process steps for forming a wafer according to the DMM are shown in FIG. 3 and described below.

In a first step 300, oxide is deposited or grown onto a silicon wafer. In a second step 310, metal or poly is deposited onto the wafer. In a third step 320, a photolithography process is performed. The third step includes the following substeps: a) coating the wafer with resist, b) exposing the wafer using a defect monitor pattern, and c) developing the pattern. In a fourth step 330, a metal or poly etching is performed in accordance with the developed pattern. In a fifth step 340, an electrical bridging test is performed for all of the bridging structures formed by way of the DMM.

A wafer formed with the DMM is very sensitive to bridging, and is actually too sensitive with respect to the actual product mask that it is supposed to represent in a testing phase. That is, the wafer formed with the DMM contains typically more metal than a wafer formed with a product mask, due to the larger number of testing structures formed by way of the DMM. Thus, with the increased metal density of the DMM-formed wafer, it can behave differently through processing steps of interest, such as patterning, cleaning, etc., with respect to a product-mask-formed wafer.

The DMM flow is short and sensitive, but the DMM pattern is quite different from the product mask, and thus the lithography and etching of the wafer with the DMM pattern may be different than a wafer formed with the product mask, due to a loading difference between the patterns. The DMM pattern typically has more metal left on the wafer after etch than the product mask, and this loading difference can lead to differences at lithography and at etch. These differences may result in bridging problems existing on the DMM-patterned wafer which do not occur in the product mask-patterned wafer, and vice versa.

Thus, it is desired to have a testing wafer that is both sensitive to bridging to the same extent as a wafer formed by way of a product mask, as well as having similar loading characteristics as the wafer formed by way of the product mask.

SUMMARY OF THE INVENTION

The invention provides a modified product mask that is used to form a wafer that is both sensitive to bridging and has similar loading characteristics as a wafer formed by using an actual product mask.

A method of creating a bridging structure for a wafer includes depositing oxide onto the wafer and depositing at least one of metal and polysilicon onto the wafer. The wafer is coated with a resist, and the coated wafer is exposed with light through a product mask that is substantially similar to an actual product mask. The coated wafer is developed, and at least one of a metal and polysilicon etching is performed on the wafer to form a wafer with a modified product pattern created thereon. Electrical bridging tests are performed on the wafer formed with the modified product pattern.

There is also a method for performing an electrical bridging test on a wafer which includes a memory cell array with a plurality of parallel conductive lines, the method includes forming a first conductive line that connects even-positioned ones of the plurality of parallel conductive lines, and forming a second conductive line that connects odd-positioned ones of the plurality of parallel conductive lines. The first conductive line is connected to a first test pad. The second conductive line is connected to a second test pad. A current is provided to one of the first and second test pads to determine if the current is detected at the other of the first and second test pads, to thereby determine if an undesired bridge exists between odd and even ones of the parallel conductive lines.

There is also a bridging test structure that includes a product array with a memory cell region having a plurality of parallel conductive lines. The bridging test structure includes a first conductive line that connects even-positioned ones of the plurality of parallel conductive lines, and a second conductive line that connects odd-positioned ones of the plurality of parallel conductive lines. A first test pad is electrically connected to the first conductive line, and a second test pad is electrically connected to the second conductive line. One of the first and second test pads is configured to receive a current to determine if the current is detected at the other of the first and second test pads, to thereby determine if an undesired bridge exists between odd and even ones of the parallel conductive lines.

BRIEF DESCRIPTION OF THE DRAWINGS

The invention will become more fully apparent from the following detailed description when read in conjunction with the accompanying drawings with like reference numerals indicating corresponding parts throughout, and wherein.

DETAILED DESCRIPTION OF THE PREFERRED EMBODIMENT

A preferred embodiment of the present invention will be described in detail hereinbelow, with reference to the accompanying drawings. Unlike a wafer formed with a DMM or a product mask of the conventional processes, a wafer formed with a modified product mask according to the invention provides for a bridging structure with a large area and with identical or nearly-identical loading as the product mask. Such a modified product mask can be utilized for products with particular "uniform" layouts, such as memory cell arrays with a plurality of horizontal conductive lines that correspond to either bit or word lines, and with a plurality of vertical conductive lines that correspond to the other of the bit or word lines. The uniform layout provides a portion of a bridging structure used to perform a bridging test on the wafer.

Figure 1:
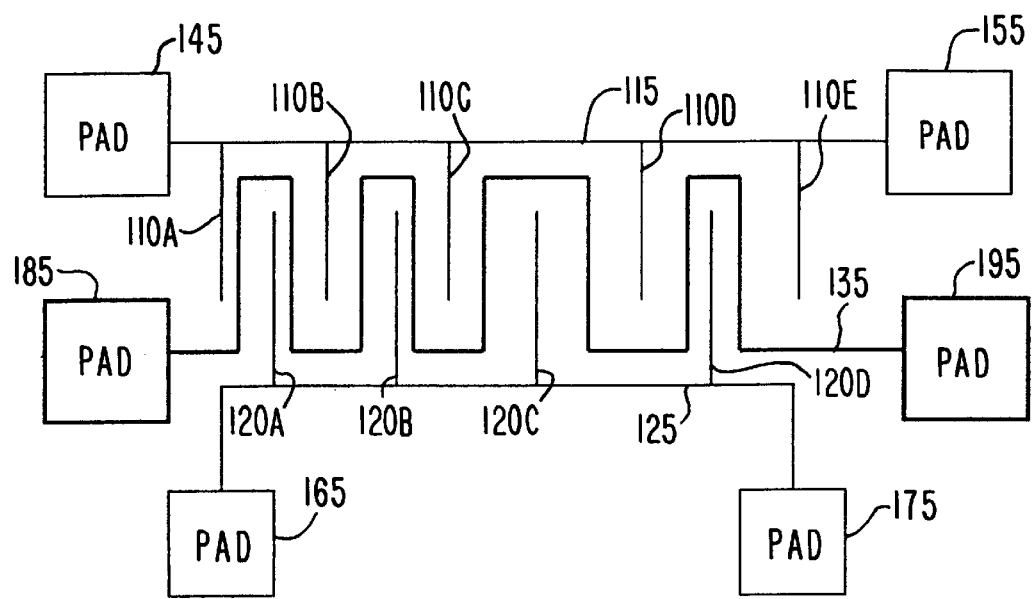
FIGS. 1 shows a top view of a bridging structure that may be used to test for bridging problems on a wafer.
Figure 2:
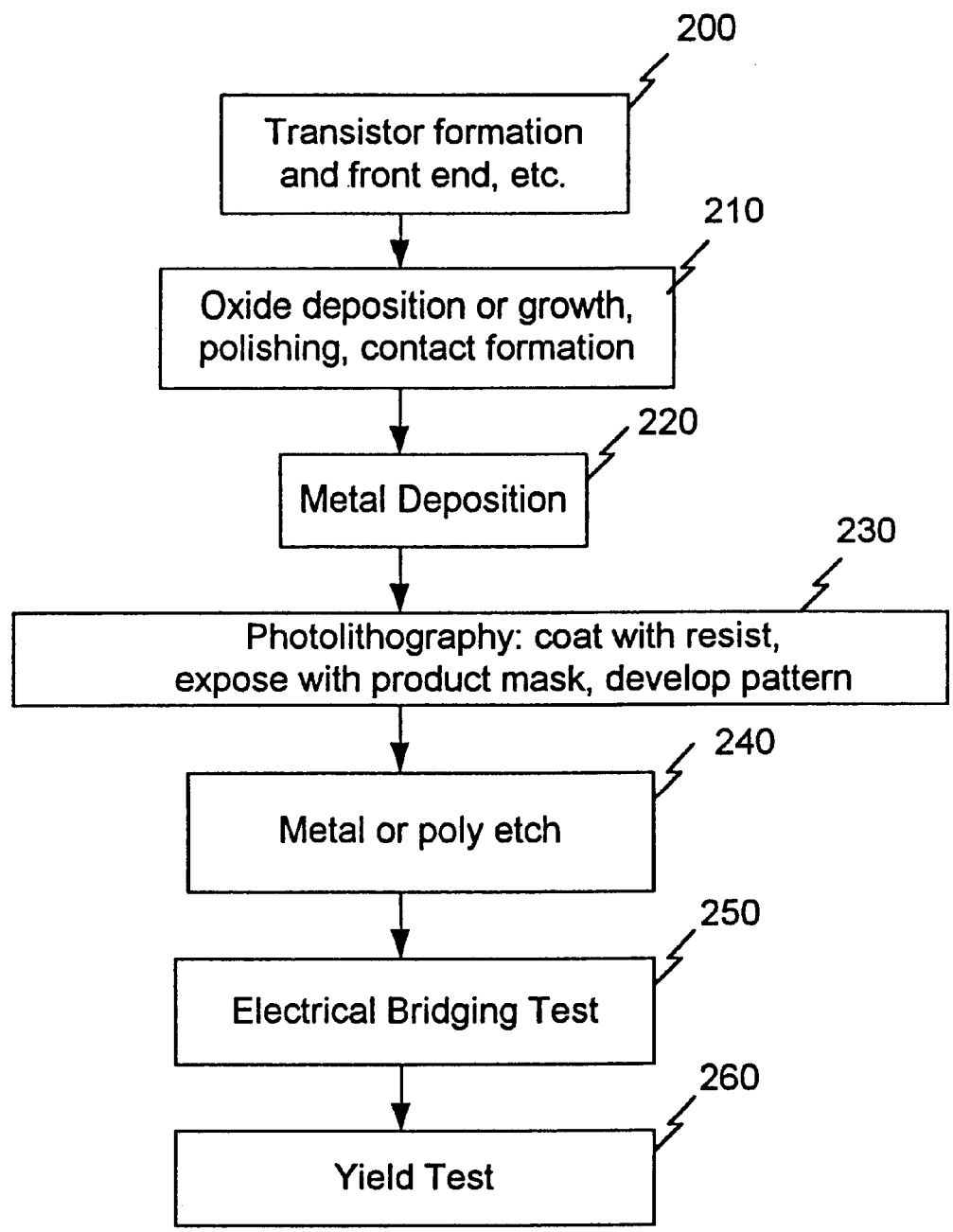
FIG. 2 illustrates the steps used in the formation of a wafer with product mask, where the wafer includes a testing area formed in the scribe line.
Figure 3:
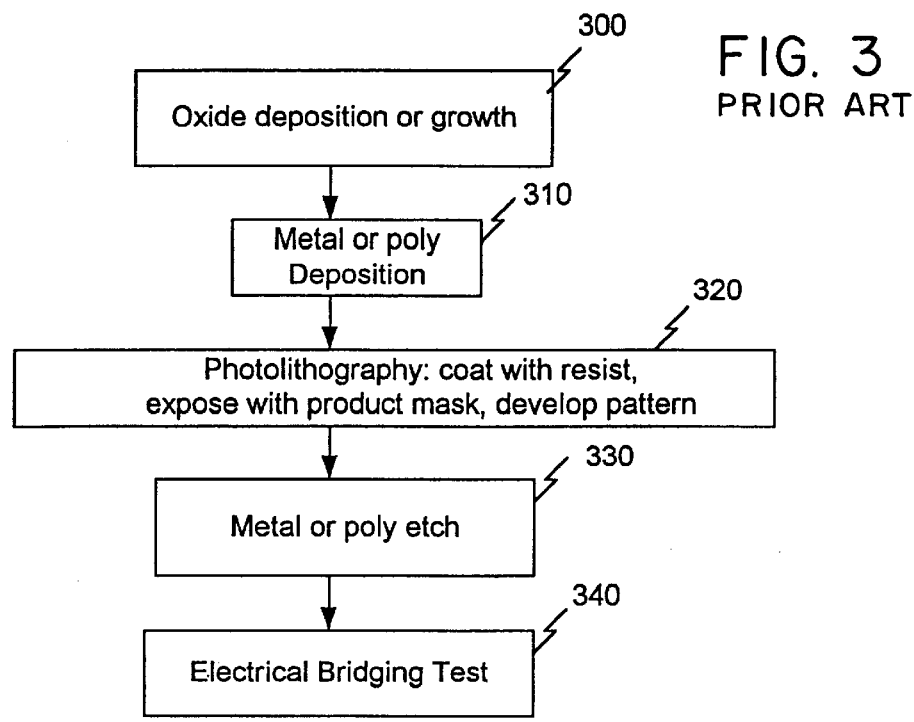
FIG. 3 illustrates the steps used in the formation of a wafer with a defect monitor mask.
Figure 4:
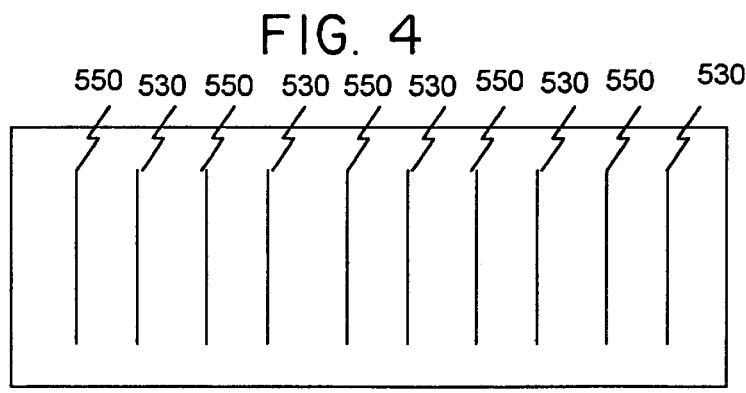
FIG. 4 shows a circuit structure that is formed by an actual product mask and that has a fairly uniform structure.
Figure 5:
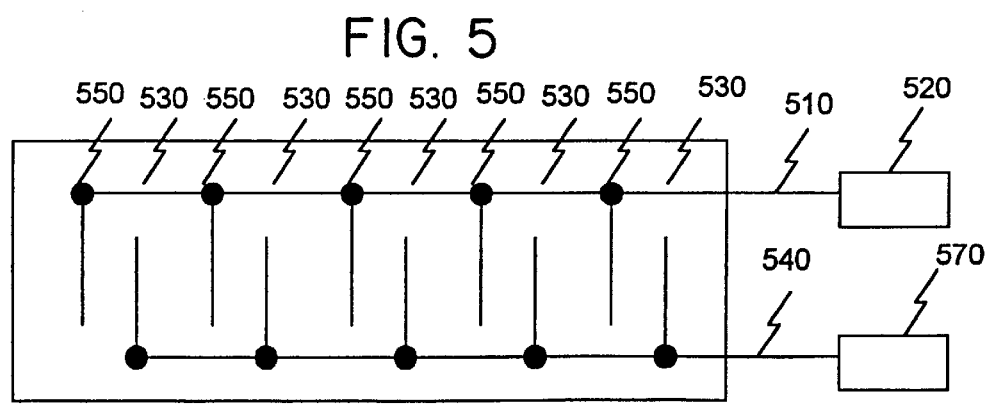
FIG. 5 shows a bridging structure according to the invention that results from the use of a modified product mask that can be used to test a batch of wafers having the circuit structure of FIG. 4.

In such a memory cell array, the actual product mask is modified so that each of the "even" vertical lines 530 of the resulting bridging structure are connected together by way of a first horizontal conductive line 510, which is connected to a first pad 520. The modified product mask also produces a bridging structure that includes a second line 540 that connects each of the "odd" vertical lines 550. The second horizontal conductive line 540 is connected to a second pad 570. FIG. 4 shows the circuit structure resulting from the use of the actual product mask for the memory cell array, where only the vertical lines (e.g., word lines) 530, 550 exist, and FIG. 5 shows the circuit structure resulting from the use of the modified product mask that includes the vertical lines 530, 550 as well as the first pad 520, the second pad 570, the first horizontal conductive line 510 and the second horizontal conductive line 540.

With such a wafer formed by a modified product mask according to the invention, current can be pumped into the first pad to see if that current shows up at the second pad. If so, there is a bridging problem, and if not, that part of the structure does not have a bridging problem. Alternatively, current can be pumped into the second pad to see if that current shows up at the first pad.

The modified product mask according to the invention is preferably utilized with products formed with fairly uniform conductive lines, such as memory cell arrays, but other types of devices having fairly uniform conductive lines can also utilized the modified product mask according to the invention. For example, a structure similar to that shown in FIG. 4, but with horizontal conductive lines formed by a product mask, can utilize a modified product mask with a first vertical conductive line that connects "odd" horizontal lines, and with a second vertical conductive line that connects "even" horizontal lines, and with two pads connected to these two horizontal lines.

In the present invention, performing bridging tests on a wafer formed with the modified product mask solves any loading problems that may exist with respect to comparison to the actual product mask. This is the case because the modified product mask is the "actual product mask" with only a few added lines to provide for the bridging testing and the connecting to test pads. In essence, an entire product array, such as a core memory array, is broken up into small sections, with each one turned into a modified product mask as shown in FIG. 5, and where each of the small sections is tested for bridging. Such a structure will behave very similar to an actual product mask during each of the process steps, since it is very close in structure to the actual product mask. For example, the widths of lines formed by way of the modified product mask is the same as the width of lines formed by the actual product mask. This is not necessarily the case for a DMM, which is formed with an entirely different mask and which would tend to have different behavioral characteristics (e.g., larger or smaller width conductive lines) as compared to the actual product mask.

For the modified product mask, the process steps as compared to those of the actual product mask are the same, except that a slightly different mask is used to form additional lines to connect similarly-positioned even conductive lines together, and to connect similarly-positioned odd conductive lines together. Such a pattern formed by use of a modified product mask will have a similar loading as a pattern formed by use of an actual product mask, and will have about the same metal density.

Figure 6:
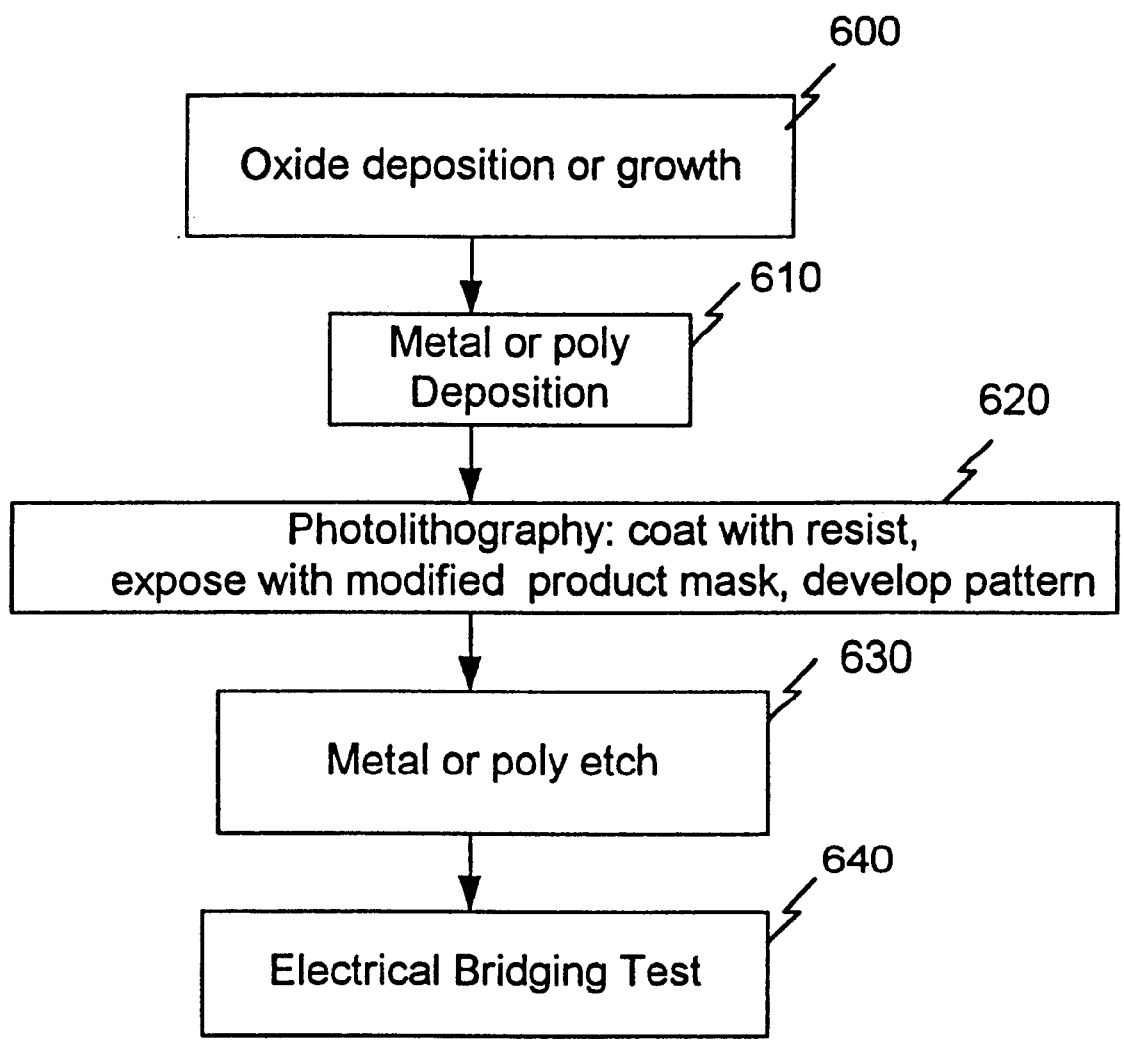
FIG. 6 illustrates the steps used in the formation of a wafer with a modified product mask according to the invention.

The process steps in the formation of a wafer by use of a modified product mask are provided in FIG. 6, and are described below.

In a first step 600, oxide is deposited or grown onto a silicon wafer. In a second step 610, metal or poly is deposited onto the wafer. In a third step 620, a photolithography process is performed. The third step includes the following substeps: a) coating the wafer with resist, b) exposing the wafer using a modified product mask pattern, and c) developing the pattern. In a fourth step 630, a metal or poly etching is performed in accordance with the developed pattern. In a fifth step 640, an electrical bridging test is performed for the modified product mask.

While a preferred embodiment has been described herein, modification of the described embodiment may become apparent to those of ordinary skill in the art, following the teachings of the invention, without departing from the spirit and scope of the invention as set forth in the appended claims.

For example, the modified product mask is described as being substantially similar to the actual product mask, since the only real difference between the two is the use of conductive lines in the circuit formed by way of the modified product mask so as to connect together particular elements of a structure formed by way of the actual product mask. For example, the circuit formed by an actual product mask in FIG. 4 is substantially the same as a circuit formed by a modified product mask in FIG. 4 except for the fact that the circuit formed by the modified product mask also includes the first and second horizontal conductive lines 510, 540. Of course, other types, numbers and directivities of conductive lines provided by way of a modified product mask in order to connect various elements of a circuit formed by way of an actual product mask, may be contemplated while remaining within the scope of the invention.

What is claimed is:

1. A method of creating a bridging structure for a wafer that includes a memory region with horizontal conductive lines and vertical conductive lines, comprising:
   a) depositing at least one of metal and polysilicon onto the wafer;
   b) coating the wafer with a resist;
   c) exposing the coated wafer with light though a modified product mask that is substantially similar to an actual product mask, wherein the modified product mask includes all conductive lines of the actual product mask and additional lines for bridging testing;
   d) developing the coated wafer;
   e) performing at least one of a metal and polysilicon etching on the wafer to form a wafer with a modified product pattern created thereon; and
   f) performing an electrical bridging test on the wafer formed with the modified product pattern.

2. The method according to claim 1, wherein a loading of the wafer formed with the modified product pattern is substantially the same as a loading of a wafer formed with the actual product mask.

3. The method for performing an electrical bridging test on a wafer which includes a memory cell array with a plurality of parallel conductive lines, wherein the memory cell array is included in other wafers in a batch of wafers that includes the wafer, the memory cell array of the other wafers being used as actual memory components in operation, the method comprising:
   a) forming, in only the wafer of the batch of wafers, a first conductive line that connects even-positioned ones of the plurality of parallel conductive lines;
   b) forming, in only the wafer of the batch of wafers, a second conductive line that connects odd-positioned ones of the plurality of parallel conductive lines;
   c) connecting, in only the wafer of the batch of wafers, the first conductive line to a first test pad;
   d) connecting, in only the wafer of the batch of wafers, the second conductive line to a second test pad; and
   e) providing, in only the wafer of the batch of wafers, a current to one of the first and second test pads to determine if the current is detected at the other of the first and second test pads, to thereby determine if an undesired bridge exists between odd and even ones of the parallel conductive lines, wherein the memory cell array of the wafer is modified to a modified cell array to thereby be tested so as to obtain a level of confidence as to proper manufacture of the memory cell arrays of the other wafers.

4. The method according to claim 3, wherein the parallel conductive lines correspond to one of word lines and bit lines of the memory cell array.

5. The method according to claim 3, wherein the parallel conductive lines are one of horizontally and vertically positioned parallel lines.

6. The method according to claim 1, wherein steps (a) through (e) are the same steps performed during formation of the actual product mask.

7. The method according to claim 1, further comprising:
   (c1) after step (c) but before step (d), connecting testing pads to each of the additional lines,
   wherein the step (f) is performed by applying a voltage to one of the testing pads while checking for a lack of voltage at another of the testing pads.

8. The method according to claim 1, wherein the location on the wafer of all of the conductive lines except the additional lines of the modified product mask correspond substantially similarly to the location of conductive lines of the actual product mask formed on another wafer.

9. The method according to claim 3, wherein the modified memory cell array is similar to the memory cell array except that the modified memory cell array further includes testing pads included for electrical bridging testing purposes.

10. The method according to claim 3, wherein the modified memory cell array is used for electrical bridging tests on the wafer without any additional testing components being added to the wafer.

* * * * *